United States Patent
Tsuyuno

(10) Patent No.: US 11,367,670 B2
(45) Date of Patent: Jun. 21, 2022

(54) POWER SEMICONDUCTOR DEVICE AND MANUFACTURING METHOD OF THE SAME

(71) Applicant: Hitachi Astemo, Ltd., Hitachinaka (JP)

(72) Inventor: Nobutake Tsuyuno, Tokyo (JP)

(73) Assignee: HITACHI ASTEMO, LTD., Ibaraki (JP)

(*) Notice: Subject to any disclaimer, the term of this patent is extended or adjusted under 35 U.S.C. 154(b) by 0 days.

(21) Appl. No.: 16/767,149

(22) PCT Filed: Nov. 5, 2018

(86) PCT No.: PCT/JP2018/040938
§ 371 (c)(1),
(2) Date: May 27, 2020

(87) PCT Pub. No.: WO2019/107077
PCT Pub. Date: Jun. 6, 2019

(65) Prior Publication Data
US 2020/0388556 A1    Dec. 10, 2020

(30) Foreign Application Priority Data
Nov. 30, 2017  (JP) .............................. JP2017-229800

(51) Int. Cl.
*H01L 23/433* (2006.01)
*H01L 21/56* (2006.01)
(Continued)

(52) U.S. Cl.
CPC ........ *H01L 23/4334* (2013.01); *H01L 21/565* (2013.01); *H01L 23/367* (2013.01);
(Continued)

(58) Field of Classification Search
CPC ............. H01L 23/4334; H01L 23/3672; H01L 23/3675
See application file for complete search history.

(56) References Cited

U.S. PATENT DOCUMENTS 6,703,707 B1 * 3/2004 Mamitsu ............. H01L 23/4006
257/718
2011/0309375 A1   12/2011 Kato
(Continued)

FOREIGN PATENT DOCUMENTS

JP    2011-217546 A    10/2011
JP    2012-004282 A     1/2012
(Continued)

OTHER PUBLICATIONS

International Search Report, PCT/JP2018/040938, dated Feb. 12, 2019, 2 pgs.

*Primary Examiner* — Yu-Hsi D Sun
(74) *Attorney, Agent, or Firm* — Volpe Koenig

(57) ABSTRACT

An object is to improve the productivity of a power semiconductor device. A power semiconductor device according to the invention includes a circuit portion having a conductor for transmitting a current and a power semiconductor element, a first base portion and a second base portion facing each other with the circuit portion interposed therebetween, and a transfer mold member which is in contact with the conductor and the power semiconductor element and is filled in a space between the first base portion and the second base portion. The first base portion includes a first flat portion that is connected to a peripheral edge of the first base portion, and a first bent portion that connects the first flat portion and another portion of the first base portion and is plastically deformed. The transfer mold member is integrally configured in contact with the first flat portion.

6 Claims, 18 Drawing Sheets

(51) Int. Cl.
    *H01L 23/367*     (2006.01)
    *H01L 23/495*     (2006.01)
    *H01L 23/00*     (2006.01)
    *H01L 25/07*     (2006.01)
    *H02M 7/537*     (2006.01)

(52) U.S. Cl.
    CPC ........ *H01L 23/49562* (2013.01); *H01L 24/73* (2013.01); *H01L 25/072* (2013.01); *H02M 7/537* (2013.01)

(56) References Cited

U.S. PATENT DOCUMENTS

| | | |
|---|---|---|
| 2014/0197532 A1 | 7/2014 | Ide et al. |
| 2017/0187300 A1 | 6/2017 | Shimazu et al. |
| 2017/0278771 A1 | 9/2017 | Kanai et al. |

FOREIGN PATENT DOCUMENTS

| | | |
|---|---|---|
| JP | 2013-143439 A | 7/2013 |
| JP | 2016-039224 A | 3/2016 |
| JP | 2017-183695 A | 10/2017 |
| WO | 2012/120594 A1 | 9/2012 |

\* cited by examiner

POWER SEMICONDUCTOR DEVICE AND MANUFACTURING METHOD OF THE SAME

TECHNICAL FIELD

The present invention relates to a power semiconductor device having a power semiconductor element mounted thereon and a manufacturing method of the same.

BACKGROUND ART

Power conversion devices using switching of power semiconductor elements are widely used for consumers, vehicles, railway, substation equipment, and the like because of high conversion efficiency. Since the power semiconductor element generates heat when energized, high heat dissipation is required. In particular, for in-vehicle applications, a highly efficient cooling system using water cooling is employed for miniaturization and weight reduction. PTL 1 discloses a power module (synonymous with a power semiconductor device) used in a power conversion device and housing a resin-molded semiconductor device in a case.

The power semiconductor device described in PTL 1 is a device in which a sealing body that seals a semiconductor element is housed in a case having a thin portion surrounding a heat dissipation plate, and after the sealing body and the case are crimped, a step of sealing between the sealing body and the case with a potting resin is required.

In recent years, there has been a demand for mass production of power conversion devices, and further improvement in productivity of power semiconductor devices has been demanded.

CITATION LIST

Patent Literature

PTL 1: JP 2016-039224 A

SUMMARY OF INVENTION

Technical Problem

An object of the invention is to improve the productivity of a power semiconductor device.

Solution to Problem

A power semiconductor device according to the invention includes a circuit portion having a conductor for transmitting a current and a power semiconductor element, a first base portion and a second base portion facing each other with the circuit portion interposed therebetween, and a transfer mold member which is in contact with the conductor and the power semiconductor element and is filled in a space between the first base portion and the second base portion. The first base portion includes a first flat portion that is connected to a peripheral edge of the first base portion, and a first bent portion that connects the first flat portion and another portion of the first base portion and is plastically deformed. The transfer mold member is integrally configured in contact with the first flat portion.

Further, a manufacturing method of a power semiconductor device according to the invention includes a first step for interposing a circuit portion, having a conductor for transmitting a current and a power semiconductor element, between a first base portion and a second base portion, a second step for pressing a part of each of the first base portion and the second base portion so as to include a part of a peripheral edge of each of the first base portion and the second base portion, and bending the first base portion and the second base portion, and a third step for bringing a mold into contact with a part of each of the first base portion and the second base portion to contact the conductor and the power semiconductor element, and injecting a mold member to be filled into a space between the first base portion and the second base portion.

Advantageous Effects of Invention

According to the invention, the productivity of a power semiconductor device can be improved.

DESCRIPTION OF EMBODIMENTS

Figure 1:
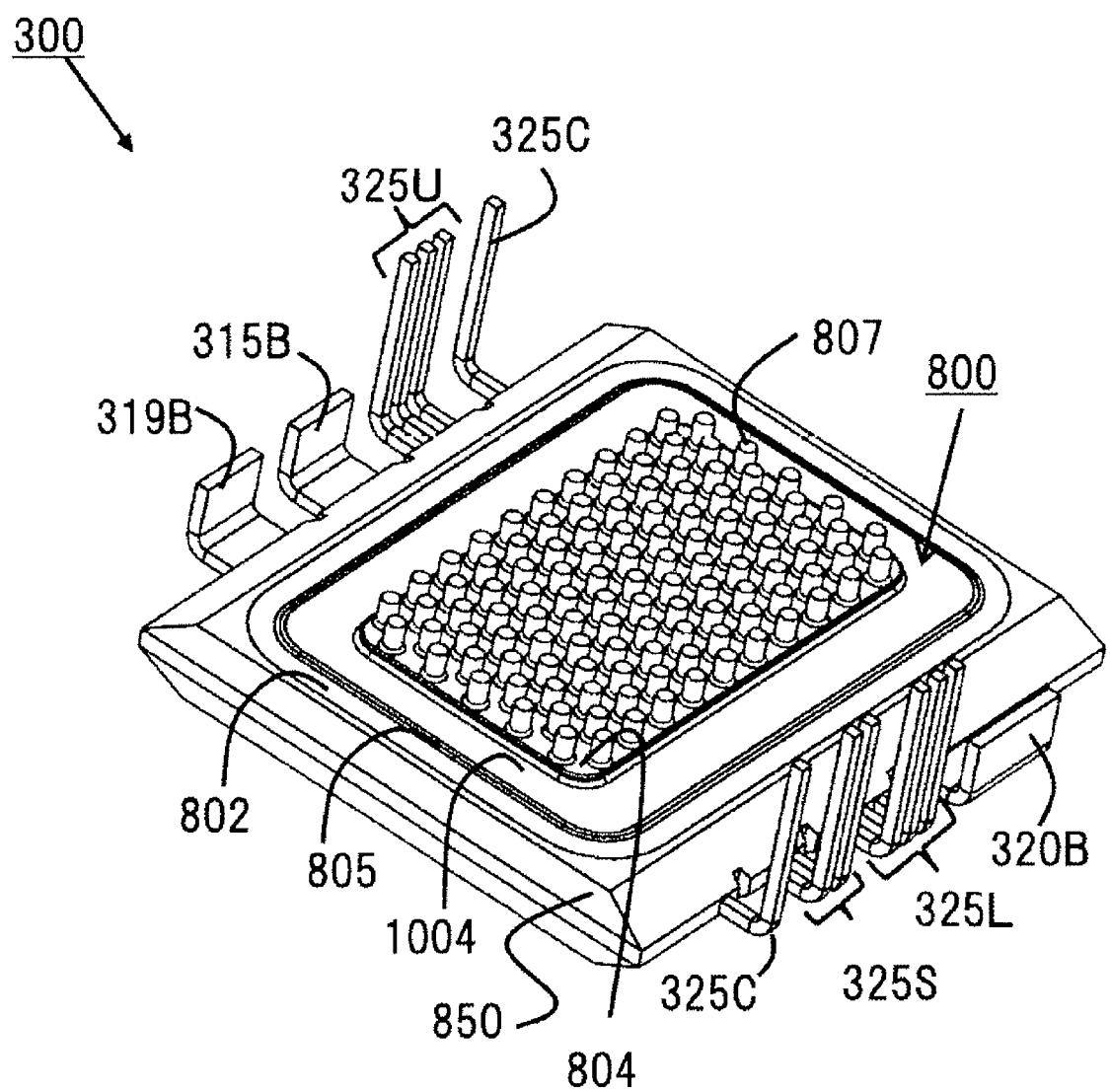
FIG. 1 is an overall perspective view of a power semiconductor device 300 according to an embodiment.

Prior to the detailed description of this embodiment, the principle, operation and effects of this embodiment will be briefly described.

A power semiconductor device according to this embodiment includes a circuit portion having a conductor for transmitting a current and a power semiconductor element, a first base portion and a second base portion facing each other with the circuit portion interposed therebetween, and a transfer mold member which is in contact with the conductor and the power semiconductor element and is filled in a space between the first base portion and the second base portion. The first base portion includes a first flat portion that is connected to a peripheral edge of the first base portion, and a first bent portion that connects the first flat portion and another portion of the first base portion and is plastically deformed. The transfer mold member is integrally configured in contact with the first flat portion.

As a result, even if the distance between the first flat portion and the second flat portion to be clamped by a mold during transfer molding changes due to component tolerances and assembly tolerances, the bent portion connected to the flat portion is plastically deformed. Therefore, during clamping of the transfer mold, it is possible to reduce the influence of the stress generated by compressing the first and second flat portions on a semiconductor element.

Further, since the bent portion is plastically deformed and a part of the flat portion is in close contact with the transfer mold, it is possible to prevent the transfer mold resin from leaking to the fin portion. By this method, a power semiconductor device having heat radiation fins can be formed collectively by transfer molding, and the starting point of peeling is reduced by integrally sealing with the transfer mold resin including the flat portion of the fin base and the end of the flat portion, thereby effectively suppressing the occurrence of peeling.

Further, the step of forming an insulating layer and the heat radiation fins after the transfer molding is not required, and the productivity can be effectively improved.

In addition, by melting and joining the fin base having the heat radiation fins and the flow path member with a metal member, it is possible to isolate a sealing resin for sealing the semiconductor element from the cooling water and to provide high waterproofness. By having high waterproofness, moisture absorption of the sealing resin by the cooling water can be prevented, and high reliability can be secured.

Hereinafter, a power semiconductor device used in a power conversion device mounted on a vehicle will be described as an embodiment of a structure according to the invention. In the embodiment of the power semiconductor device described below, a power semiconductor element as a heating element, a conductor portion on which the power semiconductor element is mounted, a base having a fin portion as a heat dissipation plate thermally connected to the heating element, and each component such as a sealing resin as a resin material for fixing the heating element and the heat dissipation plate will be described with reference to the drawings. Further, the same element in the drawings will be attached with the same symbol, and the redundant description will be omitted.

FIG. 1 is a perspective view of a power semiconductor device 300 according to an embodiment.

The power semiconductor device 300 includes a fin base 800 configured by a metal fin 807, a second base portion 804, a second flat portion 802, a bent portion 805, and an intermediate portion 1004, a transfer mold portion 850, a DC terminal 315B on a positive electrode side, a DC terminal 319B on a negative electrode side, a terminal 320B on the AC side, and signal terminals 325U, 325L, 325S, and 325C.

The fin base 800 has a bent portion 805 between the second base 804 and the second flat portion 802.

The intermediate portion 1004 forms a flow path of cooling water by performing metal fusion bonding with a flow path member (not illustrated). The intermediate portion 1004 is one step lower than the base portion 804 so that when the intermediate portion 1004 is joined to the flow path member, the flow path member does not block the liquid flow flowing to the fins.

The cooling water is isolated from the transfer mold portion 850 by a metal material such as the fin base 800 and the flow path member. Thereby, moisture absorption of the sealing resin by the cooling water can be prevented, and high reliability can be secured.

The signal terminals 325L, 325U, 325S, and 325C protrude from the two surfaces of the power semiconductor device 300 and are turned in the same direction by bending to connect to a control circuit and a driver circuit formed on a printed circuit board. Dividing the control terminals into two surfaces has an effect of easily securing a surface distance and a space distance between the terminals.

The DC terminals 315B and 319B project in a line from one surface of the power semiconductor device 300. Since the DC terminals 315B and 319B are adjacent to each other, there is an effect that input and output currents are made close to each other to reduce inductance. In addition, since the DC terminals 315B and 319B are connected to a capacitor module connected to a battery, they protrude from one surface, which has the effect of simplifying the inverter layout.

The AC terminal 320B protrudes from the surface of the power semiconductor device 300 opposite to the surface on which the DC terminals 315B and 319B are arranged. Since this is connected to the current sensor and then output from the inverter and connected to the motor, the effect of simplifying the inverter layout can be simplified by setting a direction different from the DC terminal in contact with the capacitor module.

Figure 2:
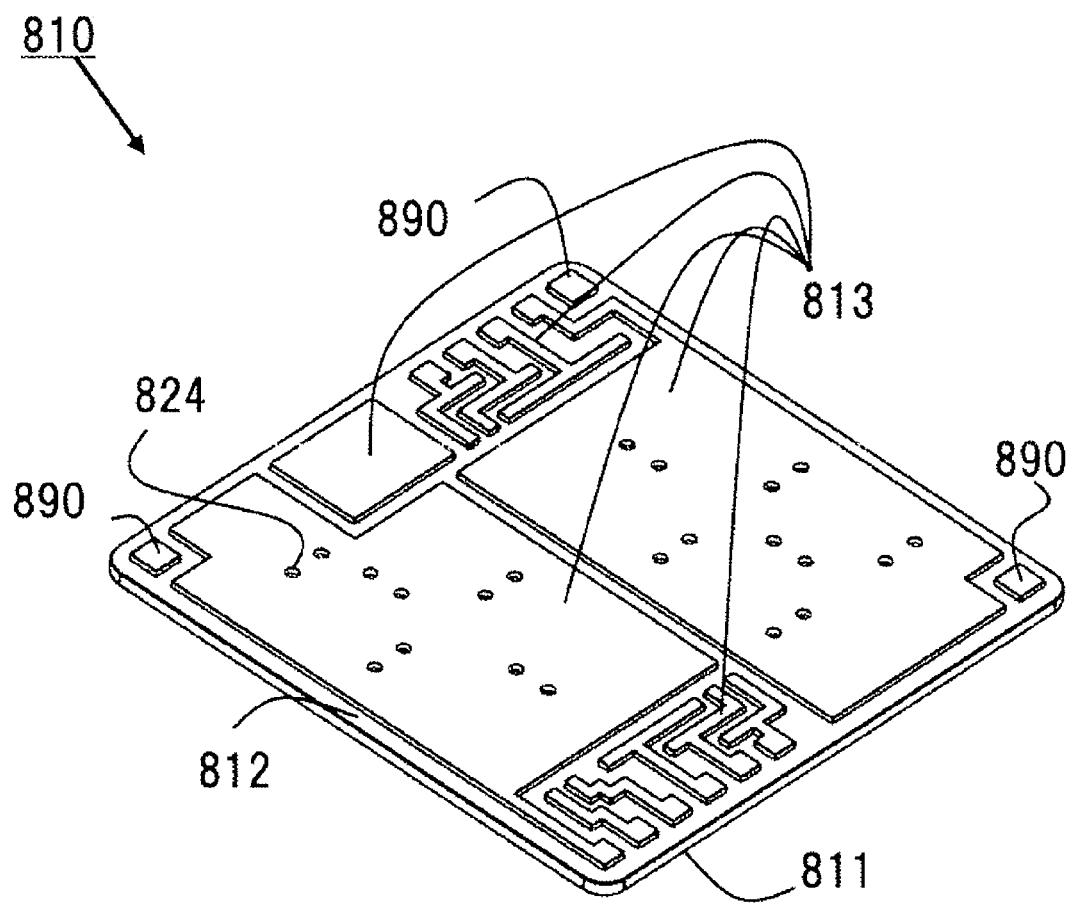
FIG. 2 is an overall perspective view of a collector-side substrate 810 provided in a power semiconductor device 300.

FIG. 2 is an overall perspective view of a collector-side substrate 810 provided in the power semiconductor device 300.

The collector-side substrate 810 includes a conductor portion 813 on which a power semiconductor element described below and a terminal described later are mounted, a first metal base 811, and a first insulating member 812 between a conductor portion 813 and the first metal base 811. In addition, the collector-side substrate 810 has a distance definition portion 890 for making the distance between the collector-side substrate 810 and an emitter-side substrate 820 described later a constant thickness.

The first metal base 811 is not particularly limited as long as it is a metal material, but is preferably copper or aluminum in terms of heat dissipation, and is preferably aluminum in terms of cost. The conductor portion 813 is not particularly limited as long as it is a material having electric conductivity, but is preferably copper or aluminum having excellent electric conductivity. It is preferable that plating including nickel plating be performed on a part or all of the conductor portion 813 in order to improve solder connectivity. The conductor portion 813 may be provided with a hole 824 in order to connect between the power semiconductor elements and prevent displacing the chip due to the surface tension of the molten solder material.

The first insulating member 812 is not particularly limited as long as it is an insulating material, but is preferably a resin in terms of cost, and is preferably a ceramic in terms of heat resistance and thermal conductivity.

Figure 3:
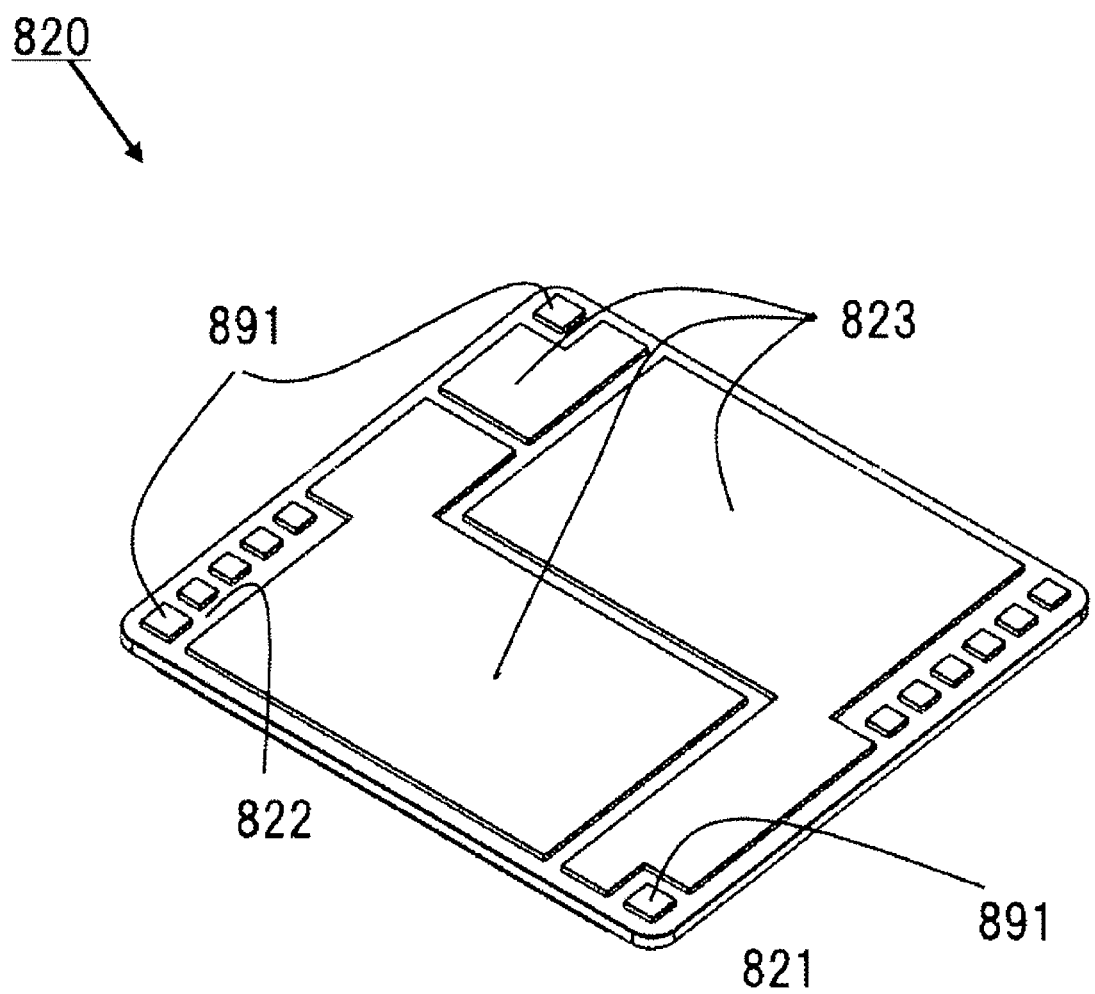
FIG. 3 is an overall perspective view of an emitter-side substrate 820 provided in the power semiconductor device 300.

FIG. 3 is an overall perspective view of the emitter-side substrate 820 provided in the power semiconductor device 300.

The emitter-side substrate 820 includes a conductor portion 823, a second metal base 821, and a second insulating member 822 between the conductor portion 823 and the second metal base 821. Further, the emitter-side substrate 820 has a distance definition portion 891 that abuts against a distance definition portion 890 on the collector-side substrate 810 side. Further, the conductor portion 823 may be provided with a protrusion for connecting to the emitter side of the power semiconductor element or a protrusion for connecting to the wiring of the collector-side substrate.

Figure 4:
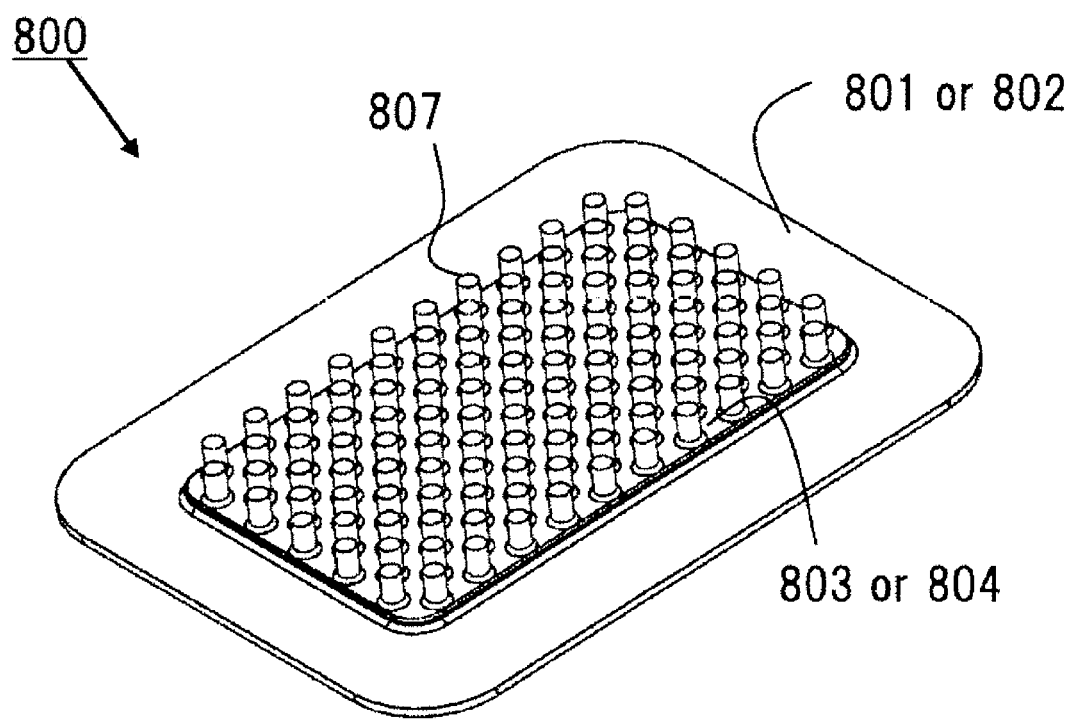
FIG. 4 is an overall perspective view of a fin base 800 provided in the power semiconductor device 300 as viewed from a fin side.

FIG. 4 is an overall perspective view of the fin base 800 provided in the power semiconductor device 300 as viewed from the fin side.

The fin base 800 includes a fin 807, a first base portion 803 or a second base portion 804 on the outer periphery of the fin 807, and a first flat portion 801 or a second flat portion 802 connected to the first base portion 803 or the second base portion 804.

The fin base 800 is not particularly limited as long as it is a metal material having high thermal conductivity and waterproofness, but aluminum is most desirable in consideration of workability and weldability with the base.

Figure 5:
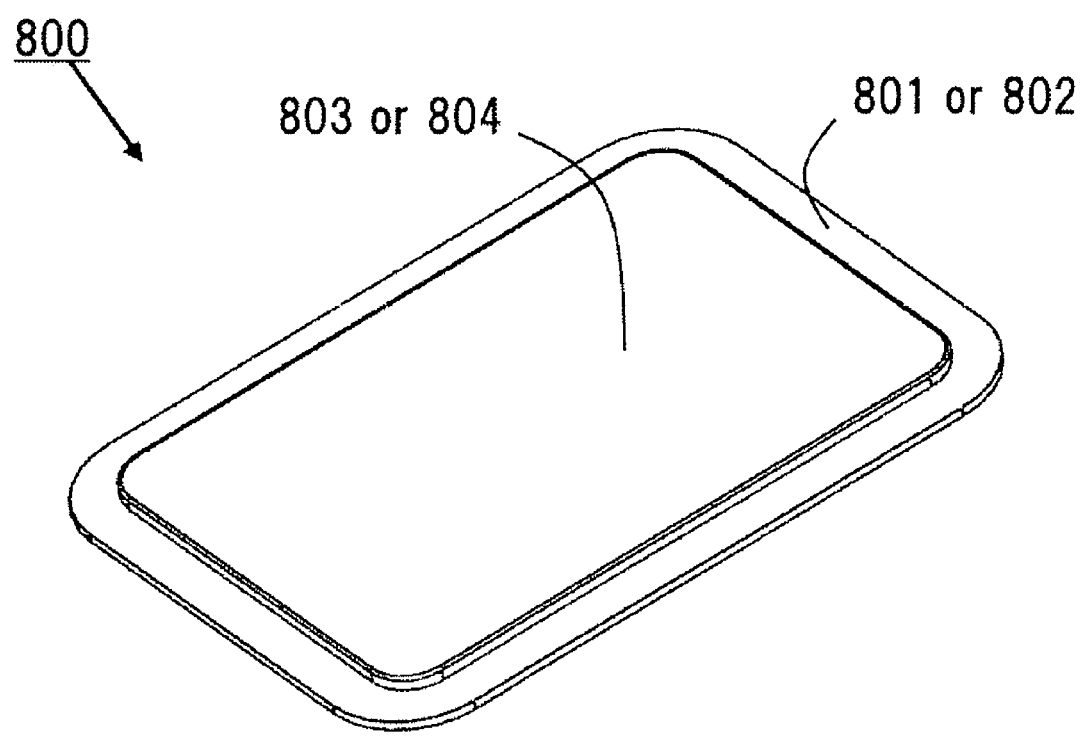
FIG. 5 is an overall perspective view of the fin base 800 provided in the power semiconductor device 300 as viewed from a fin back surface side.

FIG. 5 is an overall perspective view of the fin base 800 provided in the power semiconductor device 300 as viewed from the fin back surface side.

The fin base 800 has the first flat portion 801 or the second flat portion 802 that is one step thinner than the first base portion 803 or the second base portion 804. The first flat portion 801 or the second flat portion 802 has a high thermal conductivity because it is thinner than the first base portion 803 or the second base portion 804, and is not particularly limited as long as it is a metal material having waterproofness. Aluminum is most desirable in consideration of the weldability with the base.

Figure 6:
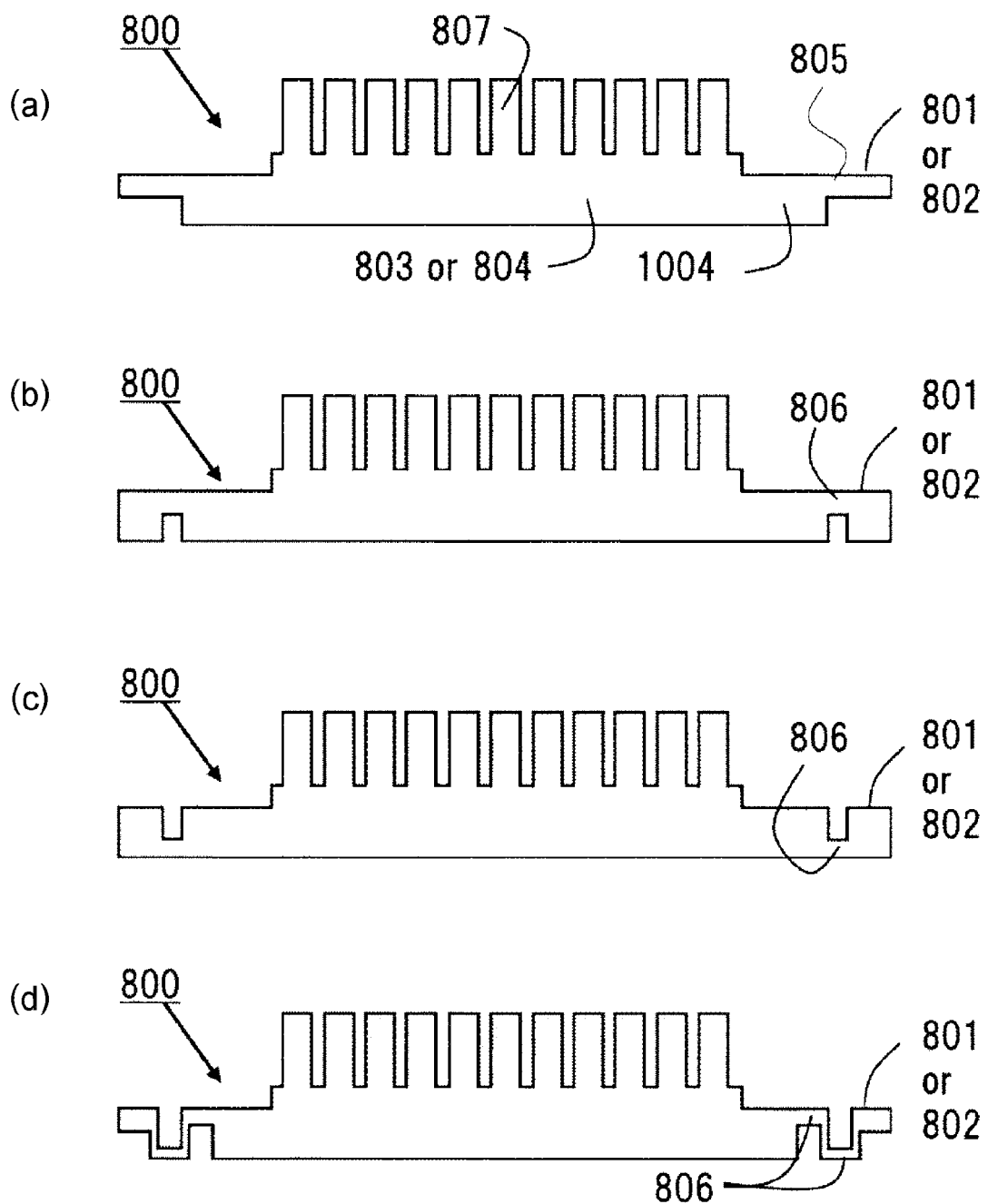
FIGS. 6(a) to 6(d) are cross-sectional views of the fin base 800 according to this embodiment.

FIGS. 6(*a*) to 6(*d*) are cross-sectional views of the fin base 800 according to this embodiment.

The fin base 800 according to (a) has the intermediate portion 1004 one step thinner than the first base portion 803 or the second base portion 804, and the first flat portion 801 or the second flat portion 802 one step lower than the intermediate portion 1004. Since the first flat portion 801 or the second flat portion 802 is thinner than the intermediate portion 1004, bending rigidity is reduced, and the bent portion 805 is formed between the base portion and the flat portion by a mold clamp during transfer molding described later.

(b), (c) and (d) are the fin bases 800 according to other embodiments, in which a cut portion 806 thinner than the first base portion 803 or the second base portion 804 and the first flat portion 801 or the second flat portion 802 is provided between the first base portion 803 or the second base portion 804 and the first flat portion 801 or the second flat portion 802.

Since the cut portion 806 is thinner than the first base portion 803 or the like, the bending rigidity is reduced, and a bend 805 is formed in the cut portion by the mold clamp during transfer molding described later. The fin base 800 is not particularly limited as long as it is a metal material having high thermal conductivity and waterproofness, but aluminum is most desirable in consideration of workability and weldability with the base.

The manufacturing process of the power semiconductor device 300 of this embodiment will be described with reference to FIGS. 7 to 12.

Figure 7:
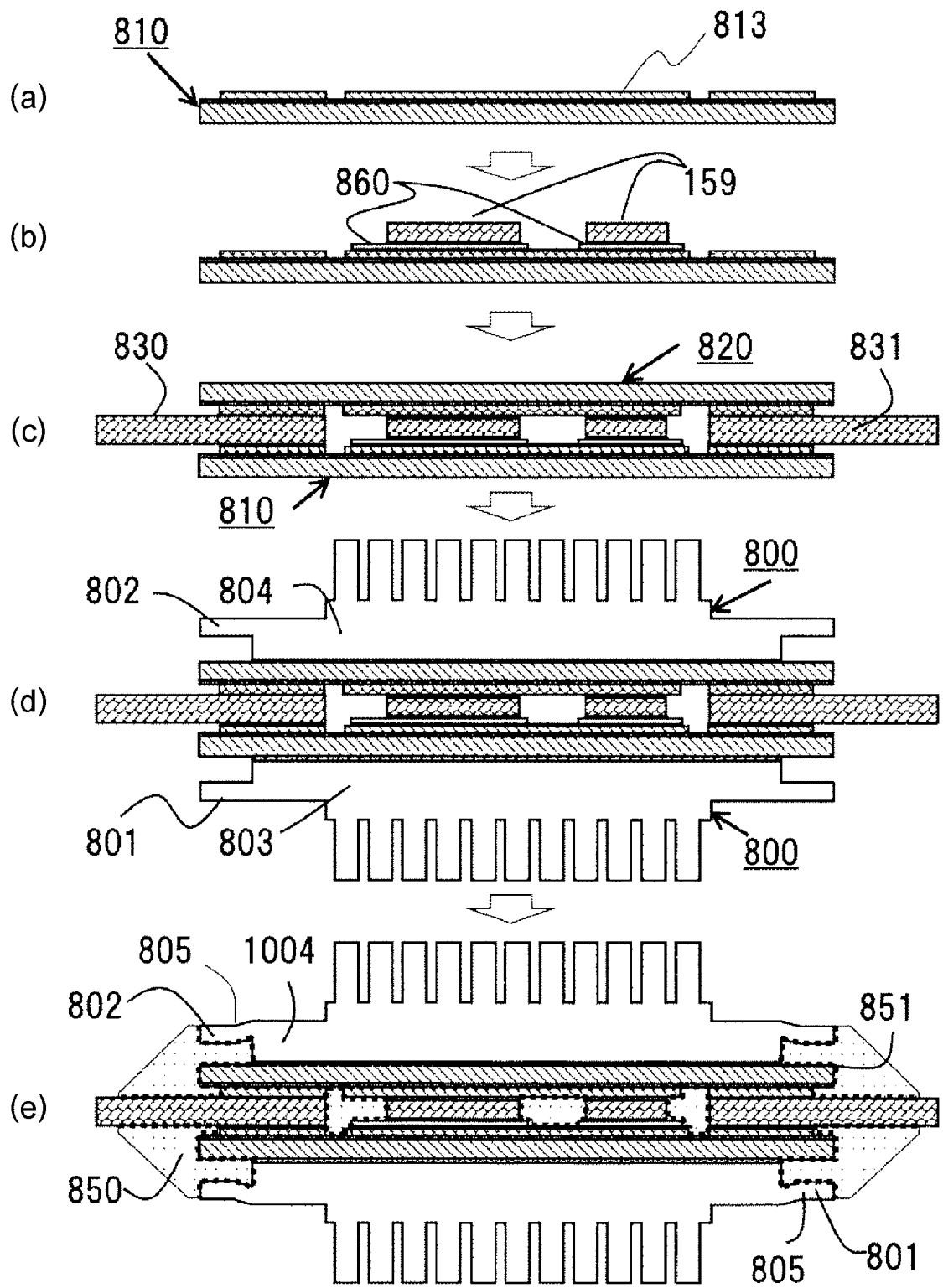
FIGS. 7(a) to 7(e) are cross-sectional views of a manufacturing process of the power semiconductor device 300 including (a) to (e).

FIG. 7 is a cross-sectional view of a manufacturing process of the power semiconductor device 300 including (a) to (e).

As illustrated in (a) and (b), a semiconductor element 860 is mounted on the conductor portion 813 of the collector-side substrate 810 via a connection member such as a solder material or a sintered metal.

Further, a metal block 159 is mounted and connected to the emitter side electrode surface of the semiconductor element 860 via a connection member such as solder. Thereafter, an Al wire (not illustrated) is connected.

The metal block 159 is not particularly limited as long as it is a metal material having electric conductivity, but copper having high electric conductivity is preferable. Aluminum may be used for weight reduction. The surface of the metal block 159 may be plated or the like in order to secure connection with the connection member.

Next, as illustrated in (c), the lead frames 830 and 831 are mounted via the connection member, and the emitter-side substrate 820 is mounted and connected via the connection member. At this time, the height of the collector-side substrate 810 and the emitter-side substrate 820 can be precisely defined by inserting the metal block 159 or the lead frames 830 and 831 into the distance definition portion 890 or the distance definition portion 891 (not illustrated).

Next, as illustrated in (d), the fin base 800 is mounted on and connected to the collector-side substrate 810 and the emitter-side substrate 820 via a connection member.

Further, as illustrated in (e), resin sealing is performed by transfer molding. Each member may be covered with a resin thin film 851 at the stage before transfer molding in order to improve the adhesion to the transfer mold resin.

Next, the transfer mold process will be described in detail.

Figure 8:
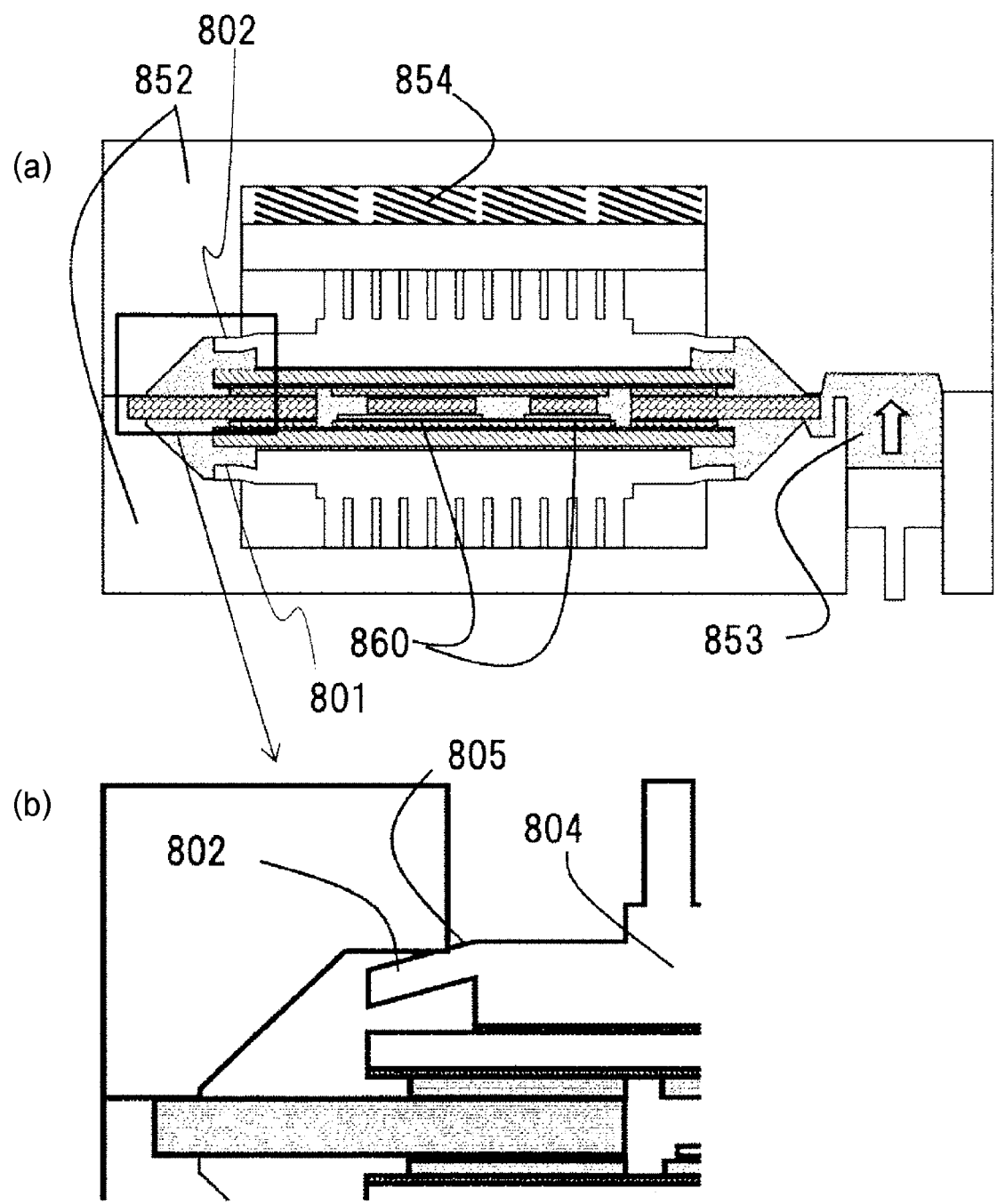
FIG. 8 is a cross-sectional view of a transfer mold process of the power semiconductor device 300 according to this embodiment, where (a) is an overall cross-sectional view and (b) is an enlarged cross-sectional view of a mold clamp portion.

FIG. 8 is a cross-sectional view of the transfer mold process of the power semiconductor device 300 according to this embodiment, where (a) is an overall cross-sectional view and (b) is an enlarged cross-sectional view of a mold clamp portion.

Tolerances caused by component tolerances and assembly tolerances are absorbed by the plastic deformation of the bent portion 805. If the distance between the first flat portion 801 and the second flat portion 802 is too large, that is, if the transfer mold 852 bites into the first flat portion 801 or the second flat portion 802, the transfer mold may be clamped. Further, the first flat portion 801 or the second flat portion may be compressed to damage the circuit portion, but the bent portion 805 is plastically deformed, so that the damage to the circuit portion can be eliminated.

If the distance between the first flat portion 801 and the second flat portion 802 is too small, the transfer mold resin cannot be stopped, and the resin flows out to the fin 807 side. For this reason, the transfer mold is set to be equal to or less than a lower limit value of the tolerance of the distance between the first flat portion 801 and the second flat portion 802, and it is necessary to compress with the mold even if the distance between the first flat portion 801 and the second flat portion 802 is lower limit.

In the transfer mold process, the bent portion 805 is formed in a space with respect to the second base portions 804 having high rigidity by clamping the second flat portion 802.

The bent portion 805 may be formed by a transfer mold, or may be formed by another mold before the transfer molding. By forming the bent portion 805 between the second flat portion 802 and the second base portion 804, the transfer mold and the second flat portion 802 are in close contact with each other, and resin leakage to the fin 807 side in the transfer mold process can be prevented.

In addition, when the transfer mold resin 853 is injected into the mold in the transfer mold process, stress is generated in a direction in which the semiconductor element is peeled off due to the injection pressure. Since the semiconductor element is weak against peeling force, a spring mechanism 854 compresses the semiconductor element with a force exceeding the pressure of resin injection during transfer molding even if the distance between the upper and lower fins varies due to tolerance, to prevent damage to the element.

Figure 9:
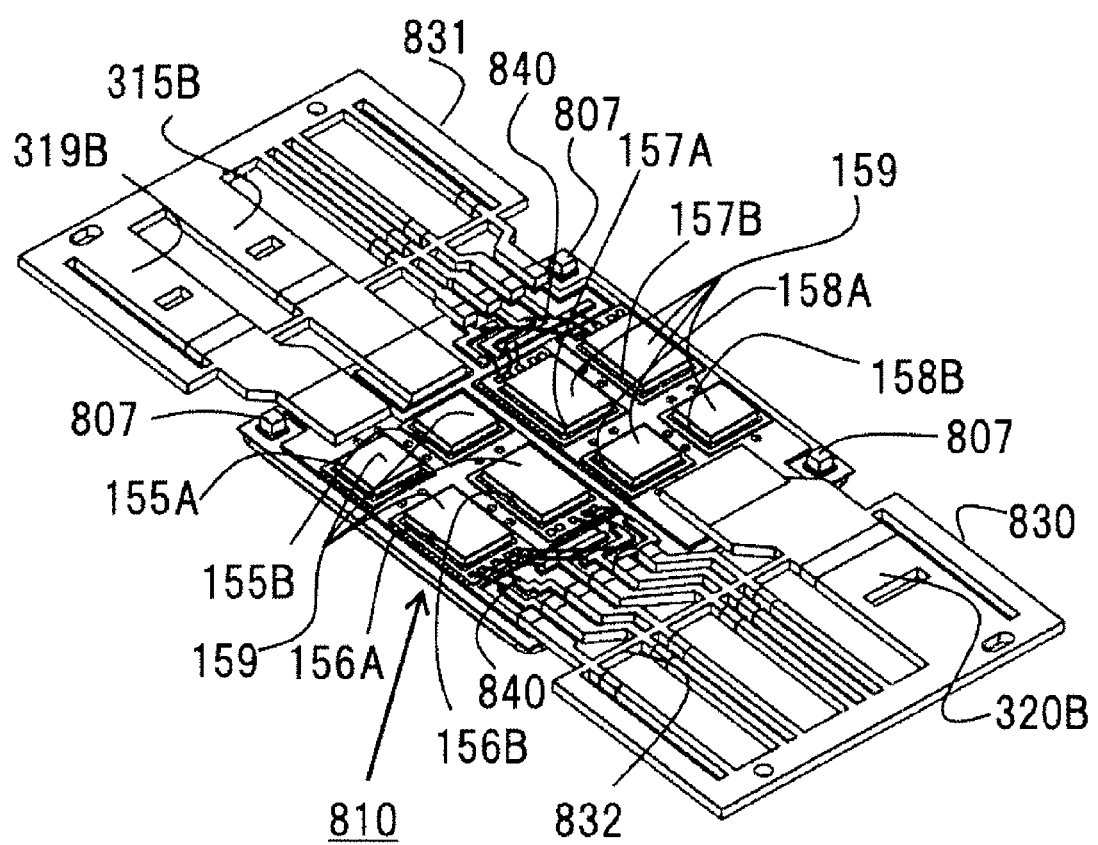
FIG. 9 is an overall perspective view of the power semiconductor device 300 in a manufacturing process corresponding to the process of FIG. 7(b).

FIG. 9 is an overall perspective view of power semiconductor device 300 in a manufacturing process corresponding to the process of FIG. 7(b).

On the collector-side substrate 810, upper arm IGBTs 155A and 155B, upper arm diodes 156A and 156B, lower arm IGBTs 157A and 157B, and lower arm diodes 158A and 158B, which are power semiconductor elements, are soldered and connected in two parallel. Here, the IGBT is an abbreviation of an insulated gate bipolar transistor. Each IGBT is connected to the conductor portion of the collector-side substrate by an Al wire 840 from the gate and temperature sense terminals. The metal block 159 is mounted on each power semiconductor element. The lead frames 830 and 831 are formed by connecting terminals with tie bars 832 so that the positions of the terminals do not shift during the transfer mold process. The Al wire 840 connects an upper arm gate signal terminal 325U and the like to the control electrode and the like of the upper arm IGBT 155A.

Figure 10:
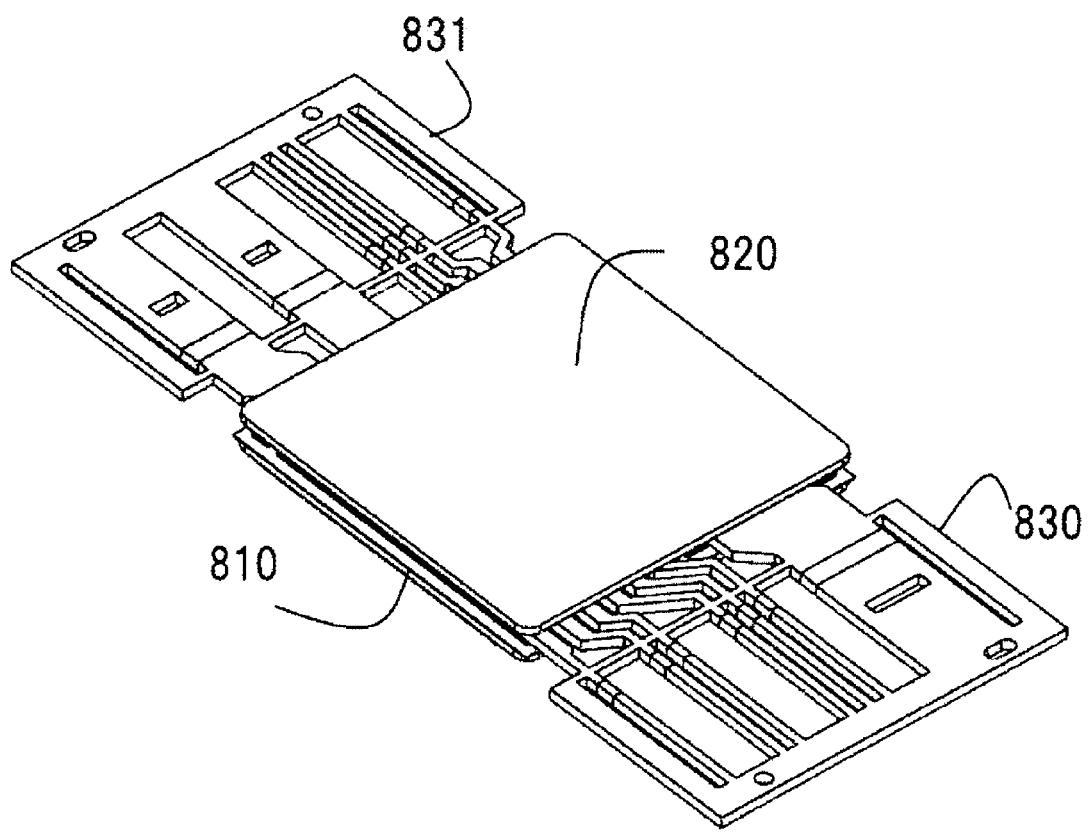
FIG. 10 is an overall perspective view of the power semiconductor device 300 in a manufacturing process corresponding to the process in FIG. 7(c). The emitter-side substrate 820 is mounted on the collector-side substrate 810.

FIG. 10 is an overall perspective view of the power semiconductor device 300 in a manufacturing process corresponding to the process of FIG. 7(c). The emitter-side substrate 820 is mounted on the collector-side substrate 810.

Figure 11:
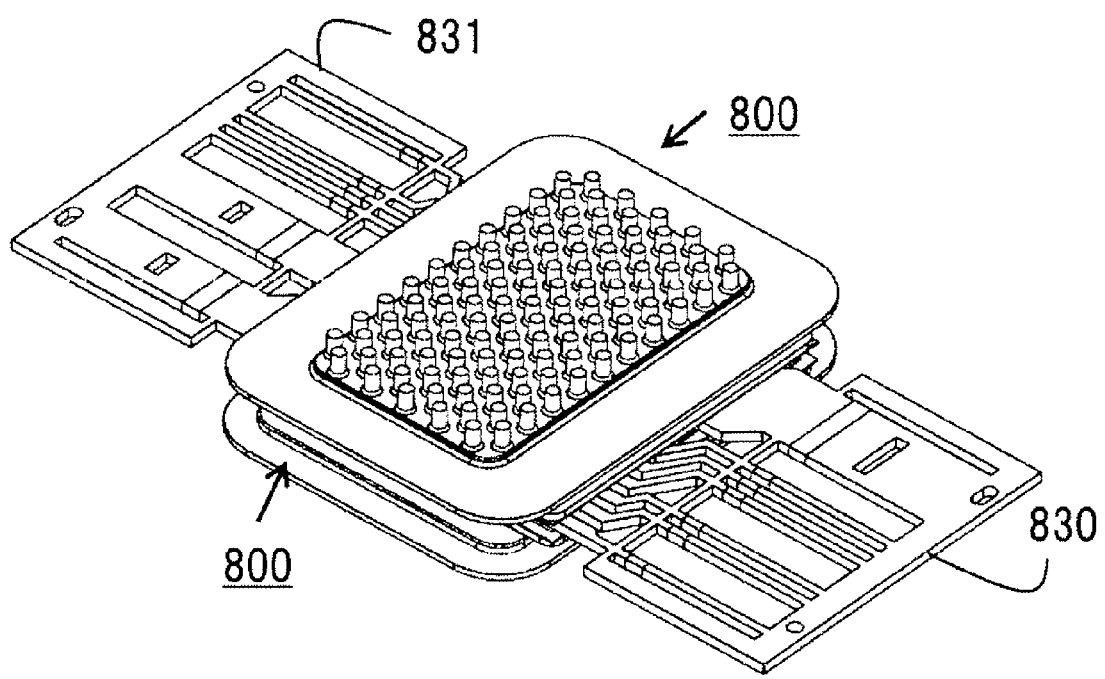
FIG. 11 is an overall perspective view of the power semiconductor device 300 in a manufacturing process corresponding to the process in FIG. 7(d).

FIG. 11 is an overall perspective view of the power semiconductor device 300 in a manufacturing process corresponding to the process of FIG. 7(d). The fin base 800 is mounted on the collector-side substrate and the emitter-side substrate.

Figure 12:
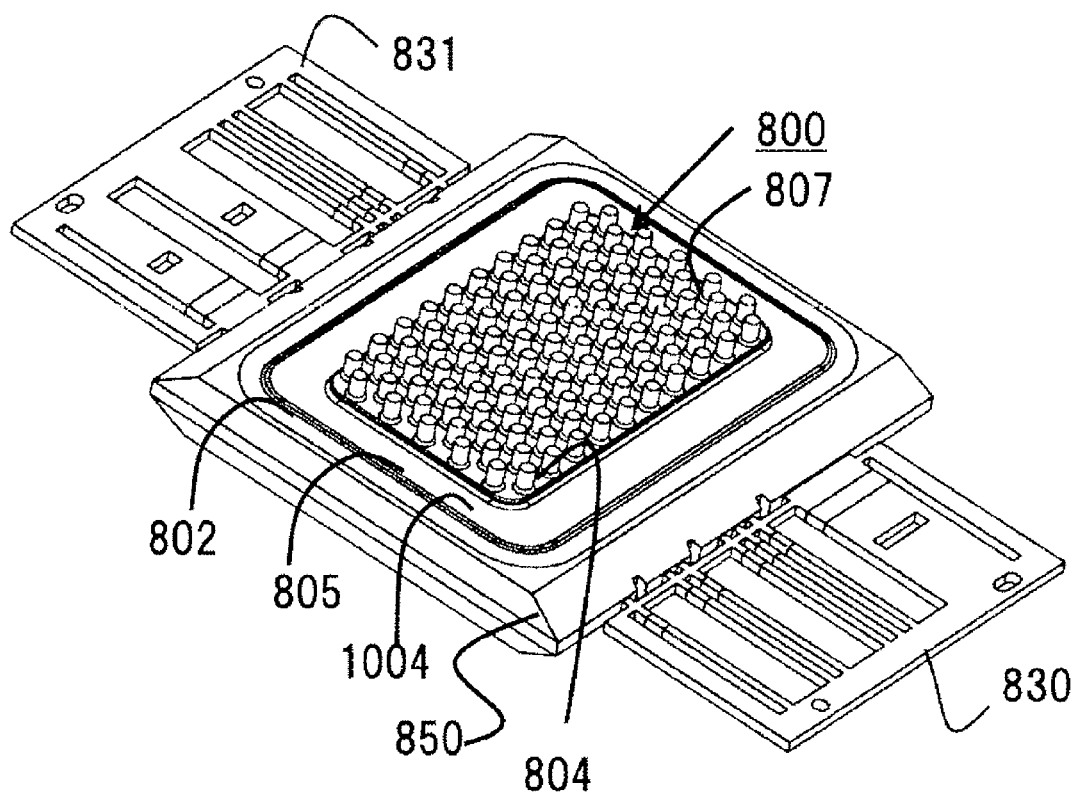
FIG. 12 is an overall perspective view of the power semiconductor device 300 in a manufacturing process corresponding to the process of FIG. 7(e).

FIG. 12 is an overall perspective view of the power semiconductor device 300 in a manufacturing process corresponding to the process of FIG. 7(e). In forming the transfer mold portion 850, the bent portion 805 is formed between the flat portion 802 of the fin base 800 and the base portion 840. Thereafter, the tie bars 832 connected to the lead frames 830 and 831 are cut to form terminals, and the power semiconductor device 300 is obtained.

Figure 13:
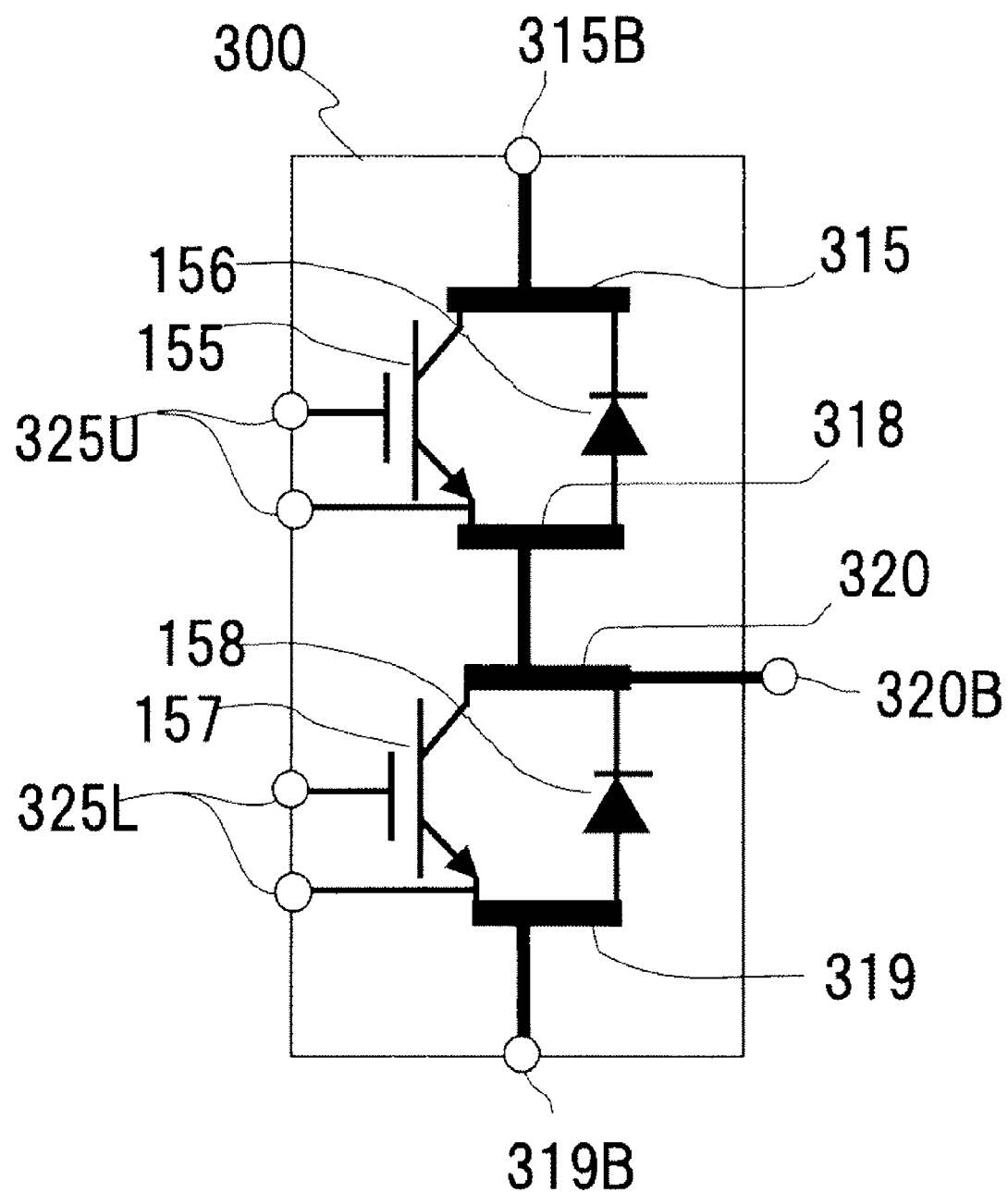
FIG. 13 is a circuit diagram of the power semiconductor device 300 of this embodiment.

FIG. 13 is a circuit diagram of the power semiconductor device 300 of this embodiment.

The DC terminal 315B outputs from the collector side of the upper arm circuit, and is connected to the positive electrode side of a battery or a capacitor. The upper arm gate signal terminal 325U outputs from the gate and emitter sense terminals of the IGBT 155 of the upper arm circuit. The DC terminal 319B outputs from the emitter side of the lower arm circuit, and is connected to the negative electrode side of the battery or capacitor, or to GND. The lower arm gate signal terminal 325L outputs from the gate and emitter sense terminals of the IGBT 157 of the lower arm circuit. The AC terminal 320B outputs from the collector side of the lower arm circuit and is connected to a motor. When grounding at neutral point, the lower arm circuit is connected to the negative electrode side of the capacitor instead of GND.

The power semiconductor device 300 according to this embodiment has a 2-in-1 structure in which two arm circuits of the upper arm circuit and the lower arm circuit are integrated into one module. When a 3-in-1 structure, a 4-in-1 structure, a 6-in-1 structure, or the like is used in addition to the 2-in-1 structure, the number of output terminals from the power semiconductor device can be reduced and the size can be reduced.

Figure 14:
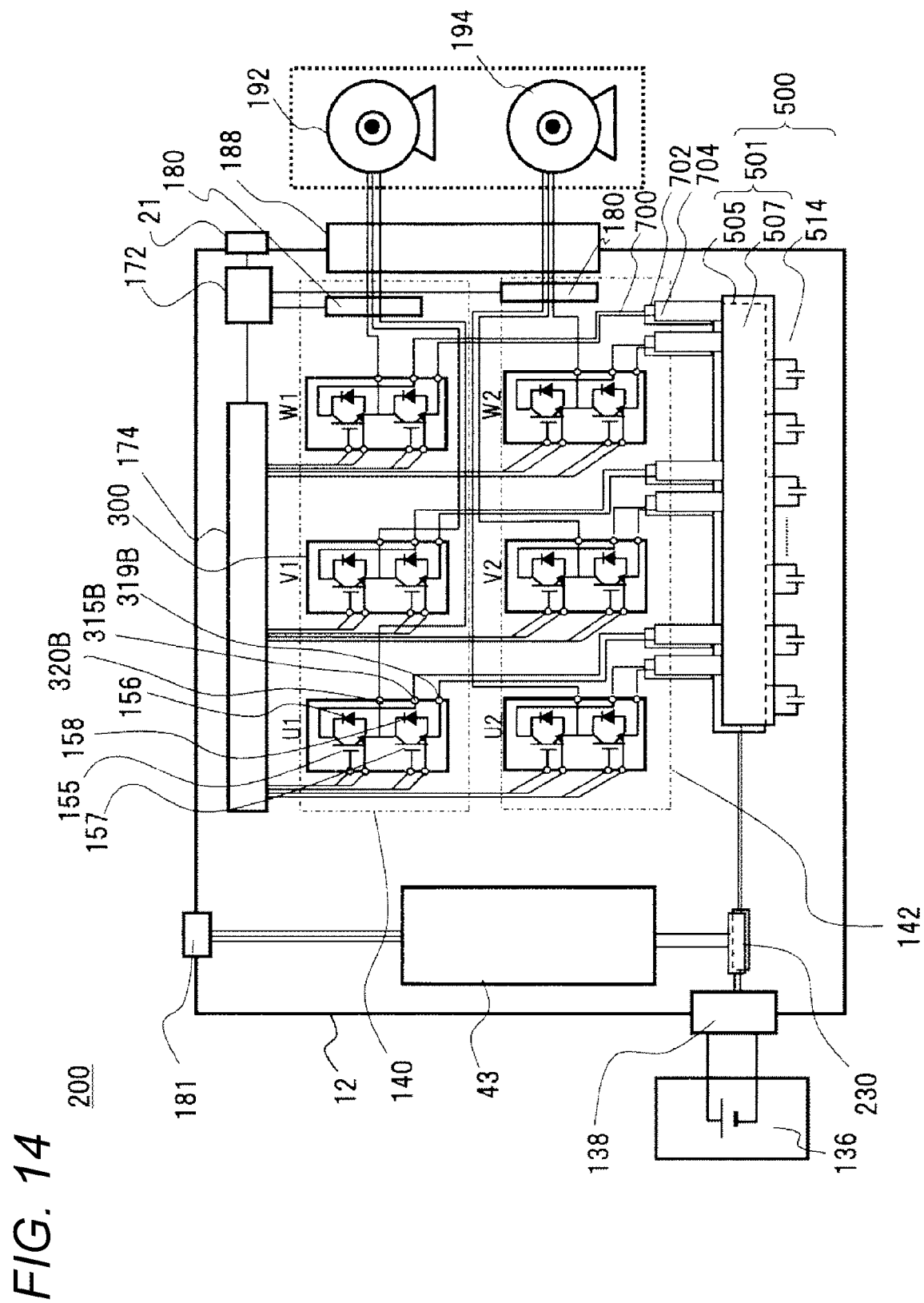
FIG. 14 is an overall perspective view illustrating the appearance of a power conversion device 200.

FIG. 14 is a circuit diagram of a power conversion device using the power semiconductor device of this embodiment. A power conversion device 200 includes inverter circuit portions 140 and 142, an inverter circuit portion 43 for auxiliary equipment, and a capacitor module 500. The inverter circuit portions 140 and 142 include a plurality of power semiconductor devices 300, and form a three-phase bridge circuit by connecting them. When a current capacity is large, the power semiconductor devices 300 are further connected in parallel, and these parallel connections are made for each phase of the three-phase inverter circuit, so that the current capacity can be increased. Further, by connecting the power semiconductor elements built in the power semiconductor device 300 in parallel, it is possible to cope with an increase in current capacity.

The inverter circuit portion 140 and the inverter circuit portion 142 have the same basic circuit configuration, and the control method and operation are basically the same. Since the outline of the circuit operation of the inverter circuit portion 140 and the like is well known, detailed description is omitted here.

As described above, the upper arm circuit includes the upper arm IGBT 155 and the upper arm diode 156 as switching power semiconductor elements, and the lower arm circuit includes the lower arm IGBT 157 and the lower arm diode 158. The IGBTs 155 and 157 receive a drive signal output from one or the other of the two driver circuits constituting the driver circuit 174, perform a switching operation, and convert DC power supplied from the battery 136 into three-phase AC power.

Each of the upper arm IGBT 155 and the lower arm IGBT 157 includes a collector electrode, an emitter electrode (signal emitter electrode terminal), and a gate electrode (gate electrode terminal). The upper arm diode 156 and the lower arm diode 158 include two electrodes, a cathode electrode and an anode electrode. The cathode electrodes of the diodes 156 and 158 are electrically connected to the collector electrodes of the IGBTs 155 and 157, and the anode electrodes are electrically connected to the emitter electrodes of the IGBTs 155 and 157 so that the direction from the emitter electrode of the upper arm IGBT 155 or the lower arm IGBT 157 toward the collector electrode is the forward direction.

Further, a MOSFET (metal oxide semiconductor field effect transistor) may be used as the power semiconductor element. In this case, the upper arm diode 156 and the lower arm diode 158 become unnecessary.

Temperature information of the upper and lower arm series circuit is input to a microcomputer from a temperature sensor (not illustrated) provided in the upper and lower arm series circuits. Further, voltage information on the DC positive electrode side of the upper and lower arm series circuit is input to the microcomputer. The microcomputer performs over-temperature detection and over-voltage detection based on the information. If over-temperature or over-voltage is detected, the microcomputer stops the switching operations of all upper arm IGBTs 155 and lower arm IGBTs 157, and protects the upper and lower arm series circuit from over-temperature or over-voltage.

Figure 15:
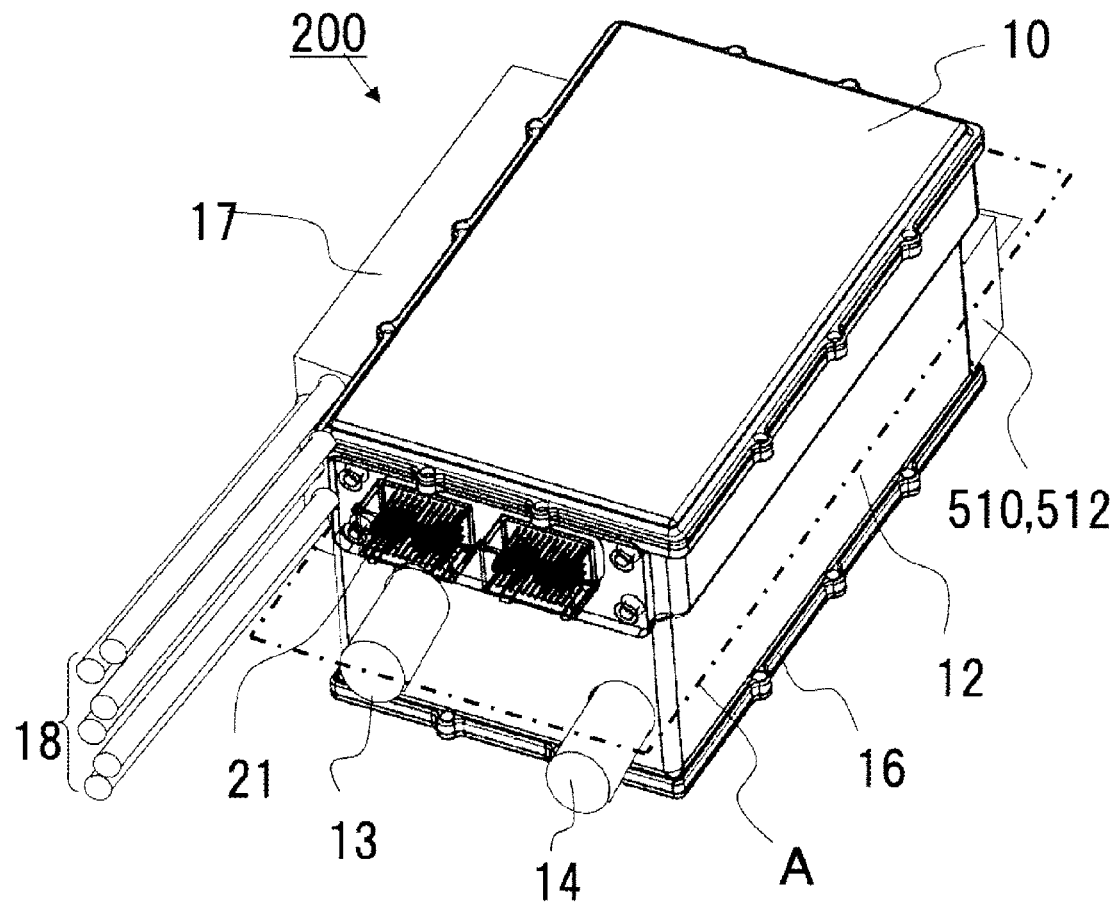
FIG. 15 is an overall perspective view illustrating the appearance of the power conversion device 200.

FIG. 15 is an overall perspective view illustrating the appearance of the power conversion device 200.

The appearance of the power change device 200 according to this embodiment is formed by fixing a housing 12 having a substantially rectangular top or bottom surface, an upper case 10 provided on one of the outer peripheries on the short side of the housing 12, and a lower case 16 for closing the lower opening of the housing 12. The housing 12 and the lower case may be formed integrally.

Since the shape of the bottom view or the top view of the housing 12 is substantially rectangular, the housing 12 can be easily mounted on a vehicle and can be easily manufactured.

Figure 16:
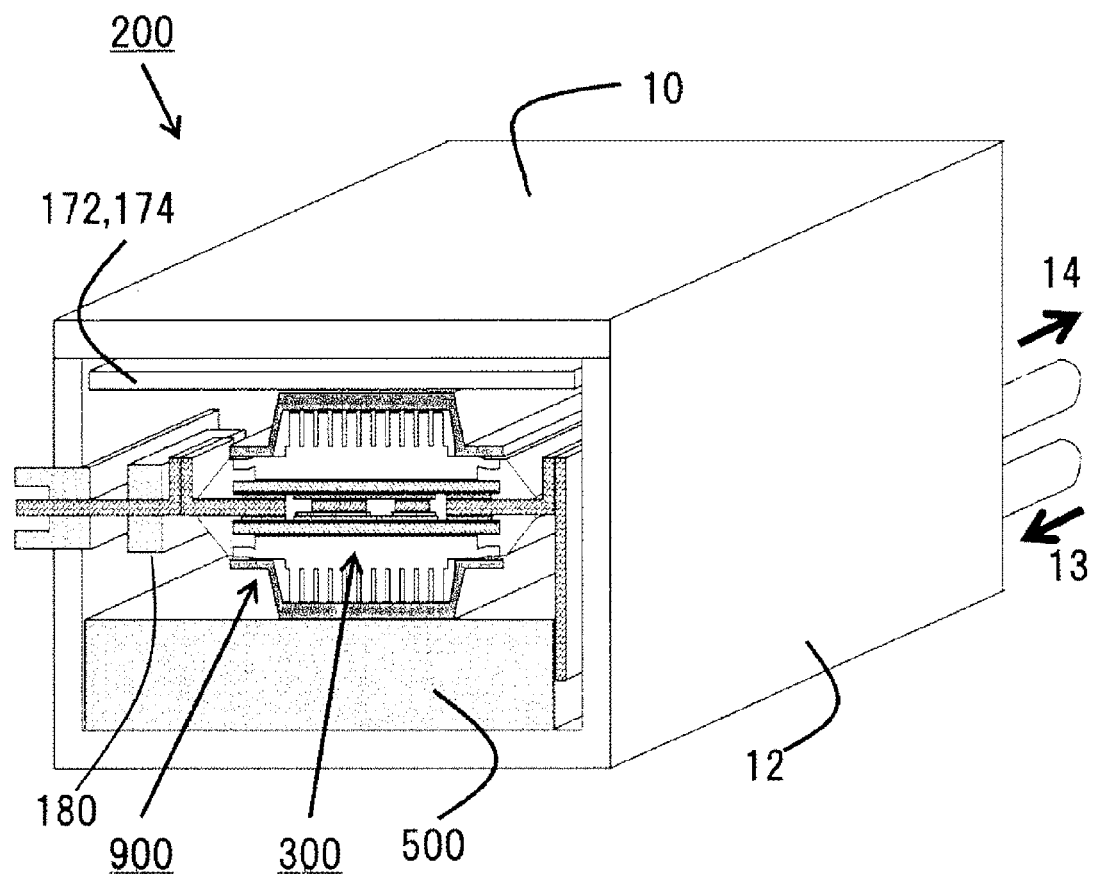
FIG. 16 is a schematic diagram illustrating a cross-sectional structure of the power conversion device 200 according to this embodiment.

FIG. 16 is a schematic diagram illustrating a cross-sectional structure of the power conversion device 200 according to this embodiment.

The power semiconductor device 300 is assembled to a flow path member to form the power semiconductor device 900 with a flow path. In the power semiconductor device 300, the AC electrode terminal is welded to a bus bar on which the current sensor 180 is mounted. The DC terminal of the power semiconductor device 300 is welded to the capacitor module 500. Next, a control circuit 172 and a driver circuit 174 on which the mounted components are mounted are assembled and connected to the signal terminals. By installing the control circuit above the power semiconductor device 900 with a flow path and the capacitor module below the power semiconductor device 900, the device can be compactly arranged and downsized.

Figure 17:
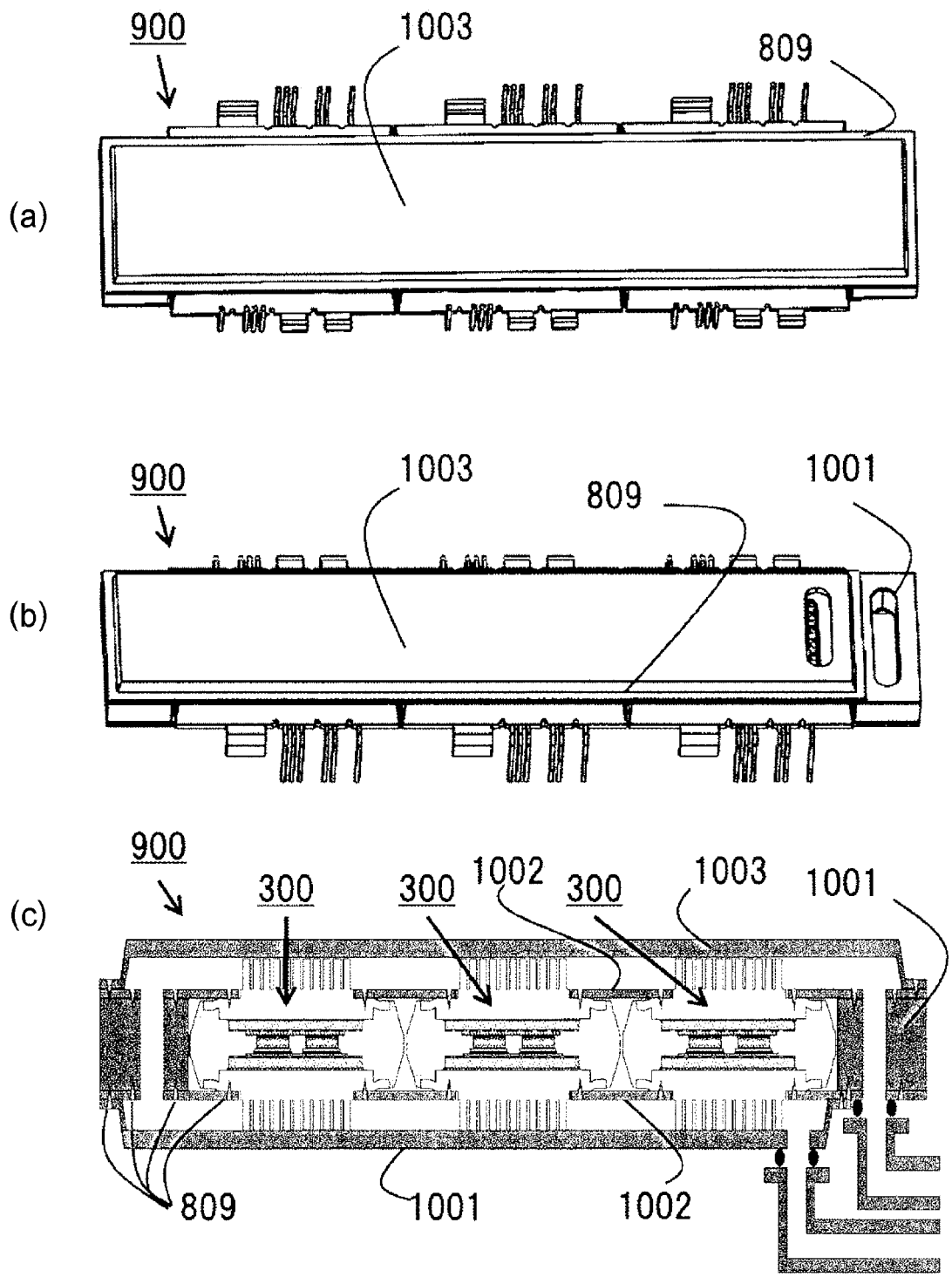
FIG. 17 illustrates the appearance of a power semiconductor device 900 with a flow path, where (a) is a perspective view of the power semiconductor device 900 with a flow path when viewed from the emitter side, (b) is a perspective view when viewed from the collector side, and (c) is a cross-sectional view.

FIG. 17 illustrates the appearance of the power semiconductor device 900 with a flow path, where (a) is a perspective view of the power semiconductor device 900 with a flow path when viewed from the emitter side, (b) is a perspective view when viewed from the collector side, and (c) is a cross-sectional view. The power semiconductor device 300 is assembled to a flow path member to form the power semiconductor device 900 with a flow path.

Figure 18:
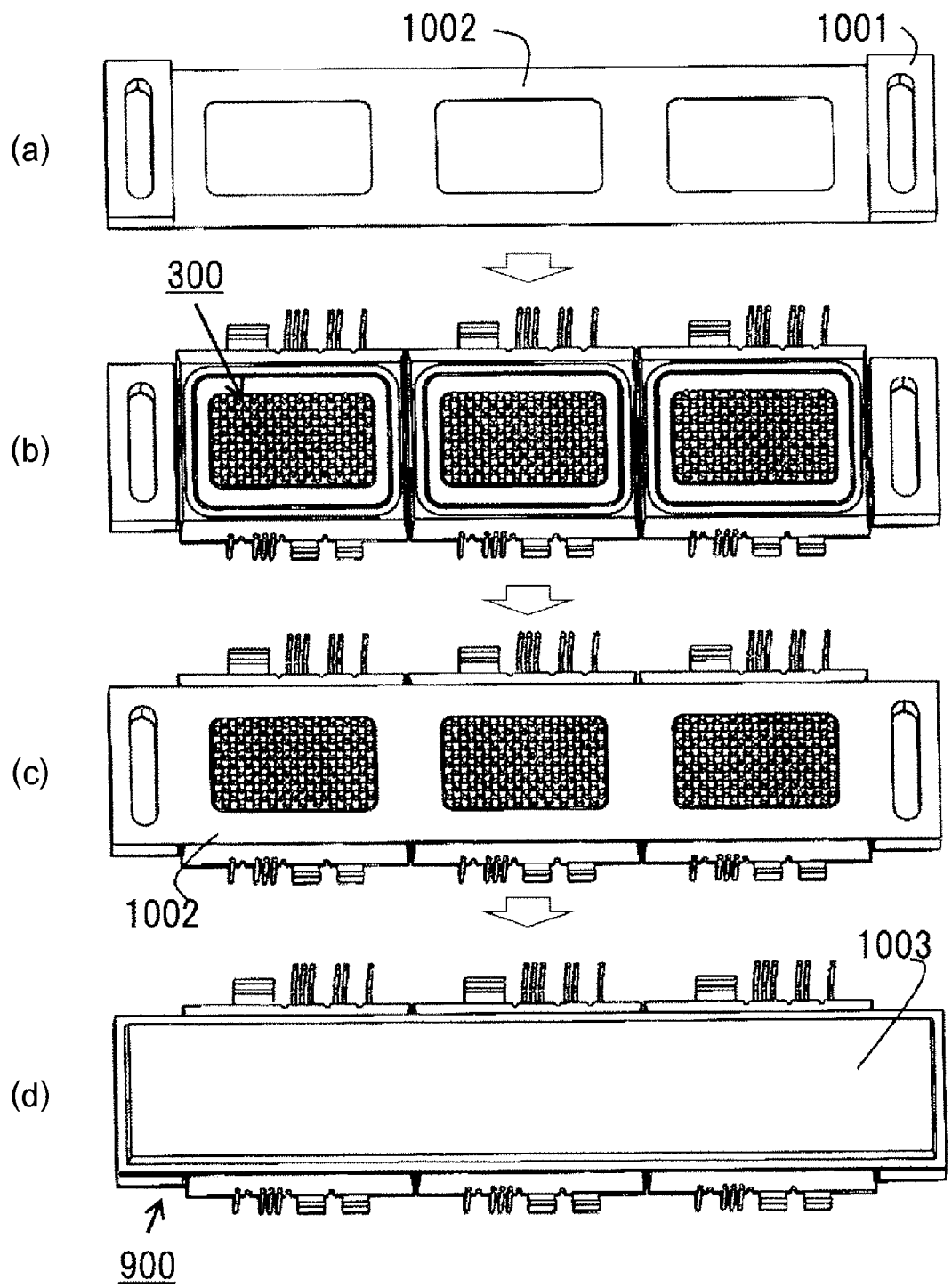
FIG. 18 is a perspective view illustrating a manufacturing process of the power semiconductor device 900 with a flow path.

FIG. 18 is a perspective view illustrating a manufacturing process of the power semiconductor device 900 with a flow path.

As illustrated in (a), a through-hole water channel 1001 is bonded to a module connection member 1002 by melting metal.

Next, as illustrated in (b), the collector side of the power semiconductor device 300 is mounted on the module connection member 1002, and the metal-melt bonding is performed.

Next, as illustrated in (c), the module connection member 1002 is mounted on the emitter side of the power semiconductor device 300, and the through-hole water channel and the power semiconductor device 300 are water-tightly bonded by melting metal.

Next, as illustrated in (d), a flow path cover 1003 is mounted on the module connection member 1002 on the collector side and the emitter side, and is water-tightly bonded by melting metal. By assembling the 2-in-1 power semiconductor device 300 as the 6-in-1 power semiconductor device 900 with a flow path, there is an effect that it is easy to assemble the power conversion device 200 while ensuring water-tightness.

REFERENCE SIGNS LIST

10 upper case
12 housing
13 cooling water inlet
14 cooling water outlet
16 lower case
18 AC terminal
19 flow path
20 water path structure
21 connector
43 inverter circuit
136 battery
138 DC connector
140 inverter circuit
142 inverter circuit
155A upper arm IGBT
155B upper arm IGBT
156A upper arm diode
156B upper arm diode
157A lower arm IGBT
157B lower arm IGBT
158A lower arm diode
158B lower arm diode
159 metal block
172 control circuit
174 driver circuit
180 current sensor
192 motor generator
194 motor generator
200 power conversion device
230 input laminated wiring board
300 power semiconductor device
315B DC terminal (positive electrode)
319B DC terminal (negative electrode)
320B AC terminal
325U upper arm gate signal terminal
325L lower arm gate signal terminal
325S temperature sense signal terminal
325C collector sense signal terminal
500 capacitor module
501 laminated wiring board
505 lead frame on negative electrode side
507 lead frame on positive electrode side
514 capacitor cell
700 laminated electrode lead frame
702 lead frame on positive electrode side
704 lead frame on negative electrode side
800 fin base
801 first flat portion
802 second flat portion
803 first base portion
804 second base portion
805 bent portion
806 cut portion
807 fin
808 circuit portion
809 metal-melt bonding portion
810 collector-side substrate
811 first metal base
812 first insulating member
813 conductor portion
820 emitter-side substrate 821 second metal base
822 second insulating member
823 conductor portion
824 hole
830 lead frame
831 lead frame
832 tie bar
840 Al wire
850 transfer mold portion
851 resin thin film
852 transfer mold
853 transfer mold resin
854 spring mechanism
860 semiconductor element
890 distance definition portion
891 distance definition portion
900 power semiconductor device with flow path
1000 flow path member
1001 through-hole water channel member
1002 module connection member
1003 flow path cover
1004 intermediate portion

The invention claimed is:

1. A power semiconductor device, comprising:
a circuit portion that includes a conductor for transmitting a current and a power semiconductor element;
a first base portion and a second base portion that face each other with the circuit portion interposed between the first base portion and the second base portion; and
a transfer mold member that is in contact with the conductor and the power semiconductor element and is filled in a space between the first base portion and the second base portion,
wherein the first base portion includes a first flat portion connected to a peripheral edge of the first base portion, and a first bent portion plastically deformed by connecting the first flat portion and another portion of the first base portion,
the transfer mold member is integrally formed in a state of being in contact with the first flat portion, and
the second base portion includes a second flat portion connected to a peripheral edge of the second base portion, and a second bent portion that connects the second flat portion and another portion of the second base portion and is plastically deformed.

2. The power semiconductor device according to claim 1, wherein the transfer mold member covers an end of the second flat portion.

3. The power semiconductor device according to claim 1, wherein the transfer mold member covers an end of the first flat portion.

4. The power semiconductor device according to claim 1, comprising
a flow path member that is connected to the first base portion by metal-melt bonding and forms a flow path,
wherein the first base portion includes a fin base on which a fin is formed, and an intermediate portion provided between the fin base and the bent portion, and
the flow path member is connected in the intermediate portion.

5. The power semiconductor device according to claim 4, wherein
a thickness of the intermediate portion is formed to be smaller than a thickness of the fin base, and
a surface of the flow path member on a flow path side is flush with a surface of the fin base on which the fin is formed.

6. The power semiconductor device according to claim 1, wherein a resin thin film is provided between the circuit portion and the transfer mold member, between the first base portion and the transfer mold member, and between the second base portion and the transfer mold member.

* * * * *